(12) United States Patent
Yamaji et al.

(10) Patent No.: US 8,704,424 B2
(45) Date of Patent: Apr. 22, 2014

(54) ELASTIC WAVE DEVICE AND ELECTRONIC DEVICE USING THE SAME

(71) Applicant: Panasonic Corporation, Osaka (JP)

(72) Inventors: Toru Yamaji, Osaka (JP); Koji Kawakita, Nara (JP); Eiji Kawamoto, Osaka (JP); Kozo Murakami, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/903,371

(22) Filed: May 28, 2013

(65) Prior Publication Data

US 2013/0257221 A1 Oct. 3, 2013

Related U.S. Application Data

(62) Division of application No. 12/903,326, filed on Oct. 13, 2010, now Pat. No. 8,471,433.

(30) Foreign Application Priority Data

Oct. 14, 2009 (JP) ................................. 2009-236937
Oct. 14, 2009 (JP) ................................. 2009-236938

(51) Int. Cl.
*H03H 9/05* (2006.01)

(52) U.S. Cl.
CPC .................................... *H03H 9/059* (2013.01)
USPC ...................................... 310/313 R; 310/348

(58) Field of Classification Search
CPC ... H03H 9/0028; H03H 9/02535; H03H 9/05; H03H 9/058; H03H 9/059; H03H 9/10; H03H 9/1064
USPC ...... 310/313 R, 313 A, 313 B, 313 C, 313 D, 310/340, 344, 348, 365, 366
See application file for complete search history.

(56) References Cited

U.S. PATENT DOCUMENTS

| 8,471,433 | B2* | 6/2013 | Yamaji et al. ............. 310/313 R |
| 2006/0192462 | A1 | 8/2006 | Iwamoto et al. |
| 2009/0051245 | A1 | 2/2009 | Takayama et al. |
| 2010/0060102 | A1 | 3/2010 | Goto et al. |

FOREIGN PATENT DOCUMENTS

WO 2006/106831 10/2006

* cited by examiner

*Primary Examiner* — Derek Rosenau
(74) *Attorney, Agent, or Firm* — Wenderoth, Lind & Ponack, LLP.

(57) ABSTRACT

An elastic wave device has the following elements: a piezoelectric substrate; an inter-digital transducer (IDT) electrode disposed on the piezoelectric substrate; internal electrodes disposed above the piezoelectric substrate and electrically connected to the IDT electrode; side walls disposed above the internal electrodes surrounding the IDT electrode; a cover disposed above the side walls so as to cover a space above the IDT electrode; an electrode base layer disposed on the internal electrodes outside the side walls; and connection electrodes disposed on the electrode base layer. Each connection electrode has a first connection electrode disposed on the electrode base layer, and a second connection electrode disposed on the first connection electrode. The horizontal sectional shape of the second connection electrode is non-circular.

8 Claims, 12 Drawing Sheets

ELASTIC WAVE DEVICE AND ELECTRONIC DEVICE USING THE SAME

This application is a divisional of U.S. application Ser. No. 12/903,326, filed Oct. 13, 2010, the entirely of which is incorporated herein by reference.

BACKGROUND OF THE INVENTION

1. Field of the Invention

The present invention relates to an elastic wave device and an electronic device using the elastic wave device, such as a portable telephone.

2. Background Art

A conventional elastic wave device is described with reference to the accompanying drawing. FIG. 14 is a sectional schematic view of a conventional elastic wave device.

Conventional elastic wave device 101 has piezoelectric substrate 102, inter-digital transducer (IDT) electrode 103, internal electrodes 104, external electrodes 111, side walls 105, cover 107, insulator 110, and connection electrodes 112.

IDT electrode 103 is disposed on piezoelectric substrate 102. Internal electrodes 104 are disposed on piezoelectric substrate 102 and electrically connected to IDT electrode 103. External electrodes 111 are disposed on insulator 110 and connected to external circuits. Connection electrodes 112 are formed on internal electrodes 104 via electrode base layer 109. Connection electrodes 112 are disposed so as to penetrate through insulator 110, and electrically connect external electrodes 111 and internal electrodes 104 via electrode base layer 109.

Side walls 105 are disposed on internal electrodes 104, on the periphery of IDT electrode 103. Cover 107 is disposed on side walls 105 via adhesive layer 106 so as to cover space 108 above IDT electrode 103.

Further, elastic wave device 101 has cover base layer 113 on cover 107, and cover reinforcing layer 114 on cover base layer 113. This structure reinforces cover 107.

Connection electrodes 112 disposed on the top side of electrode cover layer 109 are formed by two electrolytic plating treatments. Each of connection electrodes 112 has first connection electrode 112a formed by a first electrolytic plating treatment and second connection electrode 112b formed by a second electrolytic plating treatment, on the top side of electrode base layer 109. The horizontal sectional shape of second connection electrode 112b is circular.

In forming second connection electrode 112b, a photosensitive resist is formed on the top surface of first connection electrodes 112a and their peripheries before the second electrolytic plating treatment. Next, a circular mask is disposed on the top side of this resist in the top surface portion of each of first connection electrodes 112a, and the photosensitive resist is irradiated with light from the top surface of the mask. Thereby, the resist on the periphery of the mask is hardened. Next, the device is immersed in a developing solution so that the part of the resist under the mask is dissolved and removed. Thereby, an opening whose horizontal sectional shape is circular is formed. Thereafter, the second electrolytic plating treatment is performed, so that second connection electrode 112b can be formed in this opening.

When the photosensitive resist is irradiated with light from the top surface of the mask, the light passes through the photosensitive resist and radiates to the top surface of first connection electrode 112a. The radiation light is reflected by asperities on the top surface of first connection electrode 112a, and the reflected light radiates to the part of the resist under the mask.

The part of the resist under the circular mask is a circular cylinder whose horizontal sectional shape is circular. The wall surface of the peripheral edge of the circular cylinder serves as a light source that further reflects the light that has been reflected by the asperities on the top surface of first connection electrode 112a. Thus, the light reflected by the wall surface of the circular cylinder is concentrated at the center of the circular horizontal section and forms a converging axis along the vertical axis in the center of the circular cylinder.

For this reason, the photosensitive resist in the vicinity of the converging axis is hardened by the energy of the light concentrated on the converging axis, thus forming a resist block. When the device is immersed in a developing solution thereafter so that the part of the resist under the mask is dissolved and an opening whose horizontal section is circular is formed, the resist block formed in the vicinity of the converging axis does not dissolve and remains in the opening.

As a result, the reliability of second connection electrode 112b to be formed in the opening by the second electrolytic plating treatment degrades, and thus the elastic wave device has a poor yield (see International Publication No. 2006/106831, for example).

SUMMARY OF THE INVENTION

The elastic wave device of the present invention includes the following elements: a piezoelectric substrate, an inter-digital transducer (IDT) electrode, internal electrodes, side walls, a cover, an electrode base layer, and connection electrodes. The IDT electrode is disposed on the piezoelectric substrate. The internal electrodes are disposed above the piezoelectric substrate and electrically connected to the IDT electrode. The side walls are disposed above the internal electrodes, surrounding the IDT electrode. The cover is disposed above the side walls so as to cover a space above the IDT electrode. The electrode base layer is disposed on the internal electrodes outside the side walls. The connection electrodes are disposed on the electrode base layer. Further, each of the connection electrodes has a first connection electrode disposed on the electrode base layer, and a second connection electrode disposed on the first connection electrode. The horizontal sectional shape of the second connection electrode is non-circular.

In the elastic wave device of the present invention, the horizontal sectional shape of the second connection electrode is non-circular. Thus, when a photosensitive resist is hardened by irradiation of light, this shape can prevent the formation of a photosensitive resist block, which is caused by concentration of reflected light on a converging axis, in the portion where the second connection electrode is to be formed thereafter. This can improve the reliability of the formation of the second connection electrode and the yield of the elastic wave device.

DETAILED DESCRIPTION OF THE INVENTION

First Exemplary Embodiment

Hereinafter, an elastic wave device in accordance with the first exemplary embodiment of the present invention is described with reference to the accompanying drawings.

Figure 1:
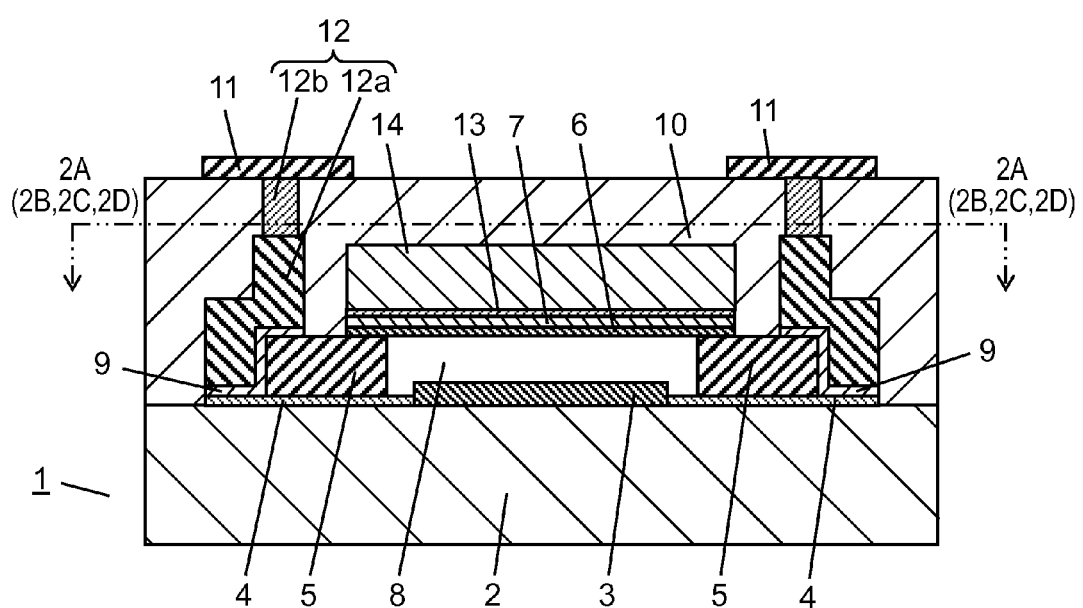
FIG. 1 is a sectional schematic view of an elastic wave device in accordance with a first exemplary embodiment of the present invention.
Figure 2A:
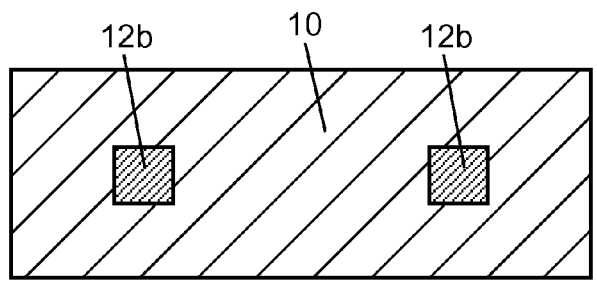
FIG. 2A through FIG. 2D are diagrams each showing a sectional shape of second connection electrodes in accordance with the first exemplary embodiment.
Figure 2B:
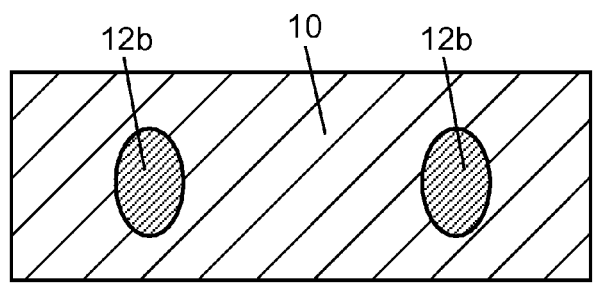
Figure 2C:
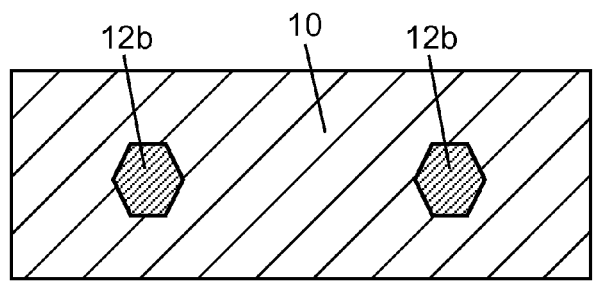
Figure 2D:
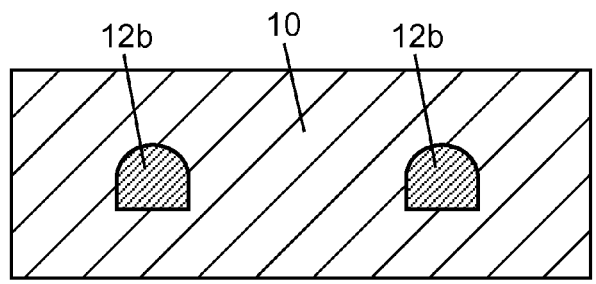

FIG. 1 is a sectional schematic view of an elastic wave device in accordance with the first exemplary embodiment of the present invention.

Elastic wave device 1 is a chip size package device. Elastic wave device 1 has piezoelectric substrate 2, inter-digital transducer (IDT) electrode 3 disposed on the top surface (principal surface) of piezoelectric substrate 2, and insulator 10 formed on piezoelectric substrate 2 so as to cover IDT electrode 3 so that IDT electrode 3 is protected from an external environment.

Elastic wave device 1 further has internal electrodes 4, side walls 5, cover 7, adhesive layer 6, cover base layer 13, cover reinforcing layer 14, electrode base layer 9, external electrodes 11 and connection electrodes 12.

Piezoelectric substrate 2 includes a single-crystal piezoelectric body approximately 100 to 350 µm in thickness. Examples of the material of piezoelectric substrate 2 include crystal, lithium tantalate, lithium niobate, and potassium niobate.

IDT electrode 3 is a comb-shaped electrode approximately 0.1 to 0.5 µm in thickness. Examples of the material of IDT electrode 3 include a metal single substance of aluminum, copper, silver, gold, titanium, tungsten, platinum, chromium, or molybdenum, alloys predominantly composed of these substances, and a laminate of these metals.

Internal electrodes 4 are disposed on piezoelectric substrate 2 and electrically connected to IDT electrode 3. Internal electrodes 4 are conductors for electrically connecting IDT electrode 3 and external electrodes 11. Examples of the material of internal electrode 4 include a metal single substance of aluminum, copper, or silver, alloys predominantly composed of these substances, and a laminate of these metals.

Side walls 5 are disposed on the top surfaces of internal electrodes 4. Each of side walls 5 is a wall approximately 5 to 15 µm in height that surrounds at least part of the periphery of IDT electrode 3. As the material of side wall 5, resin is used because the resin can be formed into a predetermined shape easily.

Cover 7 is disposed on side walls 5 so as to cover space 8 above IDT electrode 3. Cover 7 is a top plate approximately 1 to 10 µm in thickness that is held by adhesion to the top portions of side walls 5 via adhesive layer 6. Cover 7 houses IDT electrode 3, with piezoelectric substrate 2 and side walls 5. Since metal has a high mechanical strength and electrical conductivity, use of metal as the material of cover 7 allows the control of the electric potential of cover 7. Use of copper as the material of cover 7 can make the coefficient of linear expansion of the cover substantially equal to that of single-crystal piezoelectric substrate 2.

Adhesive layer 6 is disposed between cover 7 and side walls 5. Adhesive layer 6 is made of an adhesive agent approximately 1 to 10 µm in thickness. Adhesive layer 6 is made of a material that has an adhesion force to insulator 10 larger than the adhesion force of side walls 5 to insulator 10 per unit area. Adhesive layer 6 contains resin, such as epoxy resin, polyphenylene resin, and butadiene resin, or mixed resin of these materials.

In this specification, space 8 refers to a region surrounded by piezoelectric substrate 2, side walls 5 and cover 7. Space 8 is hermetic and houses IDT electrode 3 inside thereof. Space 8 may be filled with normal-pressure air. However, sealing the space under a reduced pressure can prevent corrosion of IDT electrode 3.

Cover reinforcing layer 14 contains a plating metal, and is disposed on cover 7 via cover base layer 13 so as to improve the mechanical strength of cover 7. Cover reinforcing layer 14 is a layer approximately 20 to 40 µm in thickness that is formed on the top surface of cover base layer 13 by electrolytic plating treatment. Examples of the material of cover reinforcing layer 14 include a metal single substance of copper, gold, silver, platinum, or nickel, and alloys predominantly composed of these substances. Use of copper as cover reinforcing layer 14 can provide a high mechanical strength and make the coefficient of linear expansion of the layer matched to that of piezoelectric substrate 2.

Cover base layer 13 is a metal thin film formed on cover 7, and serves as a base for electrolytic plating when cover reinforcing layer 14 is formed. Examples of the material of cover base layer 13 include a metal single substance of titanium, copper, nickel, chromium, or magnesium, and alloys predominantly composed of these substances. Especially, titanium has high adhesion, and thus is preferable as the material of cover base layer 13. When copper is disposed on titanium to form a two-layer structure of cover base layer 13, cover reinforcing layer 14 is easily formed.

Insulator 10 is formed on piezoelectric substrate 2 so as to cover cover-reinforcing layer 14. By covering the entire principal surface of piezoelectric substrate 2, insulator 10 functions to protect IDT electrode 3 from a mechanical shock, for example. Use of thermosetting resin as the material of insulator 10 can provide excellent handleability. It is preferable in terms of heat resistance and hermeticity to use epoxy resin as the material of insulator 10. It is more preferable that the epoxy resin contains inorganic filler because the inorganic filler can reduce the coefficient of linear expansion. Examples of the material of the inorganic filler include alumina powder, silicon dioxide powder, and magnesium oxide powder. The material of the inorganic filler is not limited to these powders, and various inorganic materials can be used.

Electrode base layer 9 is disposed on the top surfaces of internal electrodes 4, on the opposite sides of space 8 with respect to side walls 5, i.e. on the outer surfaces of side walls 5, and in part of the top surfaces of side walls 5. Electrode base layer 9 is a metal thin film. Examples of the material of electrode base layer 9 include a metal single substance of titanium, copper, nickel, chromium, or magnesium, and alloys predominantly composed of these substances that have solubility in plating solution lower than that of internal electrode 4. Especially, titanium has high adhesion, and thus is preferable as the material of electrode base layer 9. When copper is disposed on titanium to form a two-layer structure of electrode base layer 9, connection electrodes 12 to be described later are easily formed.

Each of connection electrodes 12 is an electrode formed by electrolytic plating treatment on internal electrode 4 and side wall 5 via electrode base layer 9. Connection electrode 12 contains a plating metal, and is disposed on electrode base layer 9 so as to penetrate through insulator 10. Thus, the connection electrode electrically connects external electrode 11 and IDT electrode 3.

Connection electrode 12 is formed by two electrolytic plating treatments. In this specification, the part formed by a first electrolytic plating treatment is denoted as first connection electrode 12a, and the part formed by a second electrolytic plating treatment as second connection electrode 12b. The horizontal sectional shape of first connection electrode 12a formed by the first electrolytic plating treatment can be an optional shape. In this exemplary embodiment, the horizontal sectional shape of second connection electrode 12b formed by the second electrolytic plating treatment is a non-circular shape.

Examples of the material of connection electrode 12 include a metal single substance of copper, gold, silver, platinum, or nickel, and alloys predominantly composed of these substances. Use of copper as the material of connection electrode 12 provides a high mechanical strength and allows the coefficient of linear expansion of the electrode to be matched to that of piezoelectric substrate 2.

Each of external electrodes 11 is an electrode formed outside insulator 10 and electrically connecting to connection electrode 12. Since insulator 10 is formed between external electrodes 11 and side walls 5 in this exemplary embodiment, external electrodes 11 are not in direct contact with side walls 5.

As described above, in elastic wave device 1 of this exemplary embodiment, the horizontal section of second connection electrode 12b of each connection electrode 12 has a non-circular shape. Thus, when a photosensitive resist is hardened by irradiation of light, this shape can inhibit the concentration of reflected light and the resulting increase in the light energy in the vicinity of the conversing axis in the portion where second connection electrode 12b is to be formed by the second electrolytic plating thereafter, which are caused when the horizontal section has a circular shape. As a result, this shape can prevent the formation of a photosensitive resist block in the portion where second connection electrode 12b is to be formed, and improve the reliability of the formation of second connection electrode 12b and the yield of elastic wave device 1.

FIG. 2A through FIG. 2D are diagrams each showing a sectional shape of second connection electrodes 12b in accordance with the first exemplary embodiment. FIG. 2A through FIG. 2D show sectional shapes taken on lines 2A-2A (2B-2B, 2C-2C, and 2D-2D, respectively) of FIG. 1. The sectional shape of second connection electrode 12b is a non-circular shape. Here, the non-circular shape includes all the shapes other than the circular shape. For example, second connection electrode 12b may have the following sectional shapes: a quadrangular shape of FIG. 2A; an elliptical shape of FIG. 2B such that the ratio of the long axis to the short axis is equal to or greater than 1.2; a polygonal shape of FIG. 2C such that the number of sides is equal to or smaller than 16 (a hexagonal shape in the example of FIG. 2C); and a shape of FIG. 2D that includes a straight part having a length ranging from 35 μm to 80 μm inclusive in the peripheral edge thereof.

Especially a structure where the horizontal sectional shape of second connection electrode 12b includes a straight part having a length ranging from 35 μm to 80 μm inclusive in the peripheral edge thereof can completely prevent the formation of a photosensitive resist block in the portion where second connection electrode 12b is to be formed, and considerably improve the yield of elastic wave device 1. The shape other than the straight part can be an optional shape, and is not limited to the shape of FIG. 2D.

Next, hereinafter, a description is provided for a method for manufacturing elastic wave device 1 in accordance with the first exemplary embodiment of the present invention.

FIG. 3A through FIG. 3C, FIG. 4A through FIG. 4C, and FIG. 5A through FIG. 5C are diagrams each showing a manufacturing process of elastic wave device 1 in accordance with the first exemplary embodiment.

Figure 3A:
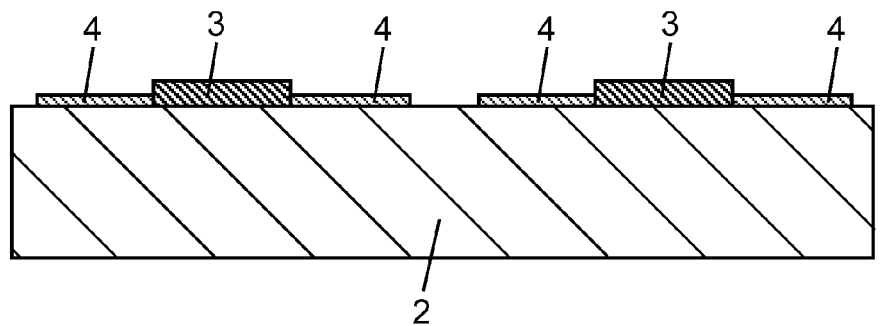
FIG. 3A through FIG. 3C, FIG. 4A through FIG. 4C, and FIG. 5A through FIG. 5C are diagrams each showing a manufacturing process of the elastic wave device in accordance with the first exemplary embodiment.

First, as shown in FIG. 3A, on the surface of piezoelectric substrate 2, a plurality of IDT electrodes 3 is sputtered and internal electrodes 4 are deposited by a photolithography technique using a resist.

Figure 3B:
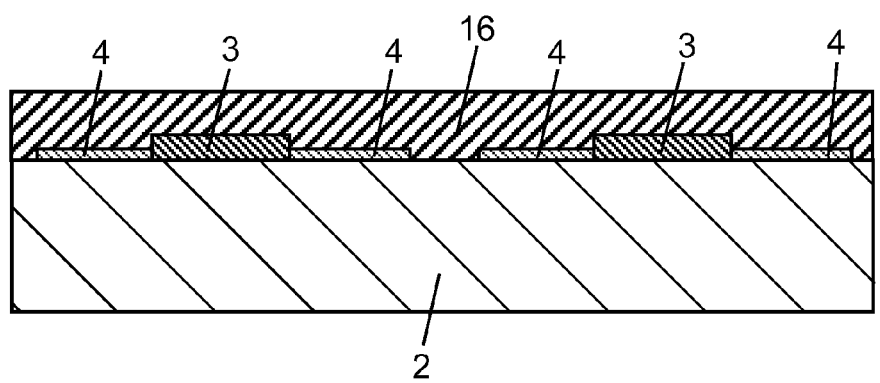

Next, as shown in FIG. 3B, photosensitive polyimide resin 16 is formed entirely on the principal surface of piezoelectric substrate 2. Polyimide resin 16 is formed by a film forming method, such as a spin-coating method, a dispensing method, and a screen-printing method. Polyimide resin 16 is formed so as to cover IDT electrodes 3 and internal electrodes 4. Use of the spin-coating method to form polyimide resin 16 can provide a uniform film thickness.

Figure 3C:
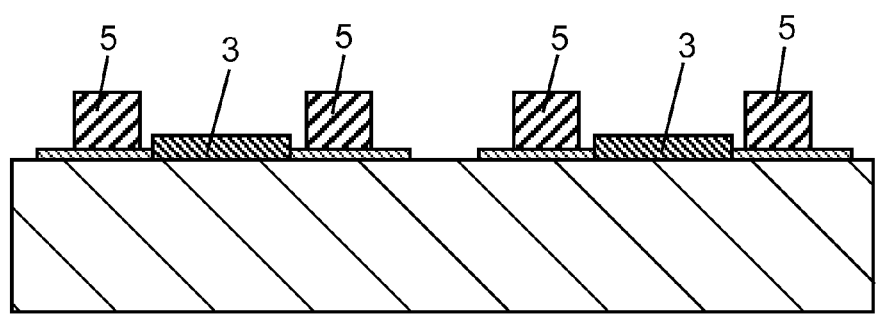

Next, polyimide resin 16 is exposed to light from the top surface, developed, and thermo-set. Thereby, as shown in FIG. 3C, side walls 5 surrounding IDT electrodes 3 can be formed. In this process, after side walls 5 are worked into a predetermined shape, the side walls are subjected to heat treatment as necessary so that the setting of the material is promoted.

Figure 4A:
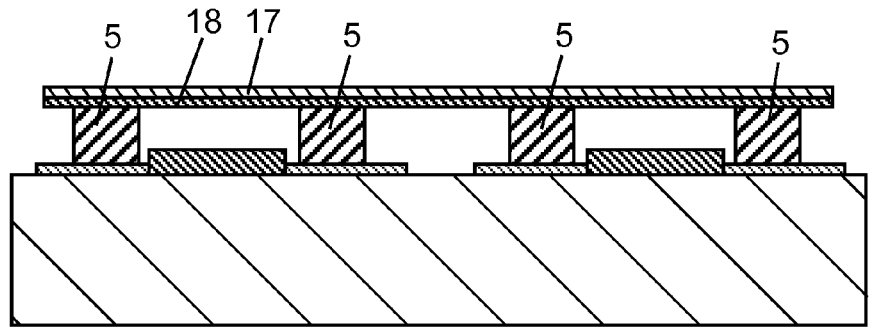

Next, as shown in FIG. 4A, metal foil 17 for forming cover 7 is bonded to the top surfaces of side walls 5 via adhesive agent 18. Then, by photolithography using a resist (not shown), metal foil 17 is etched into a predetermined pattern shape. After the resist is removed, unnecessary portions of adhesive agent 18 are removed by dry etching. Thereby, as shown in FIG. 4B, a structure where cover 7 and adhesive layer 6 cover space 8 above IDT electrode 3 can be obtained.

Figure 4B:
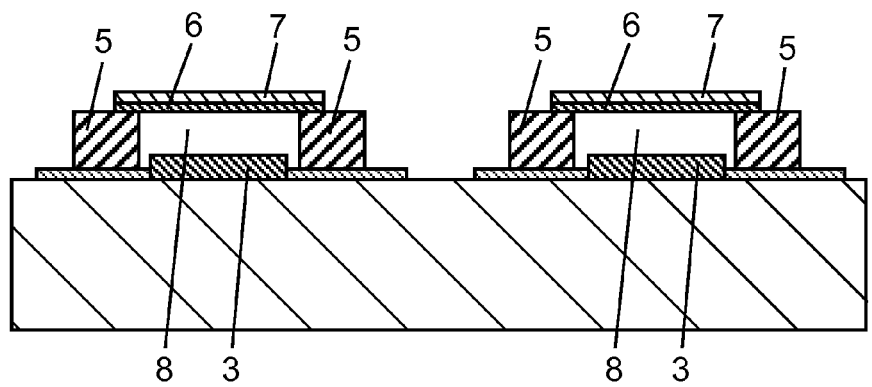

In the structure of FIG. 4B, preferably, cover 7 and adhesive layer 6 do not remain on the entire top surface of each side wall 5. That is, preferably, cover 7 and adhesive layer 6 are formed inside the outer edge of the top surface of side wall 5 as viewed from the top. This is intended to avoid the following problem. If cover 7 and adhesive layer 6 protrude outwardly from the top surface of side wall 5 as viewed from the top, base layer 19 is difficult to adhere to the outer side surface of side wall 5 and the border portion between side wall 5 and piezoelectric substrate 2 when base layer 19 is sputtered thereafter.

Figure 4C:
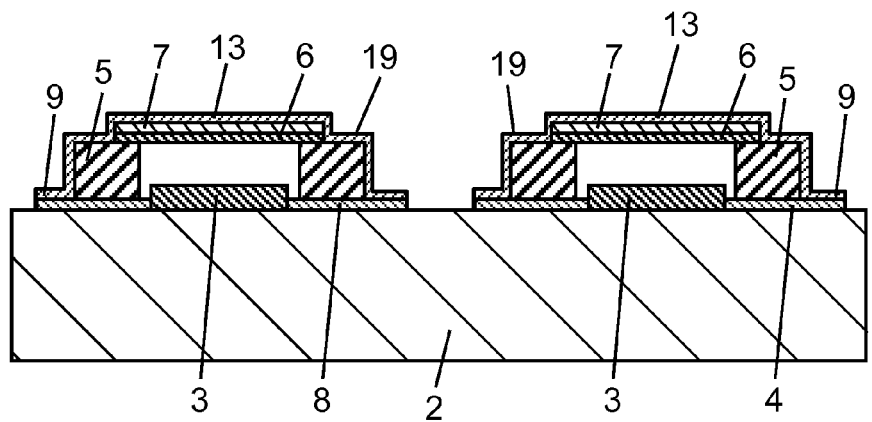

Next, as shown in FIG. 4C, base layer 19 that covers the top surface sides of internal electrodes 4, side walls 5, and cover 7 is formed by sputtering. Then, a resist (not shown) is formed by a photolithography technique on the top surface of base layer 19, in the portions other than connection electrodes 12 and cover reinforcing layer 14 to be formed next by the electrolytic plating growth. In this base layer 19, the part formed on the top surface of cover 7 is cover base layer 13, and the part formed on the top surface of internal electrode 4 is electrode base layer 9.

Figure 5A:
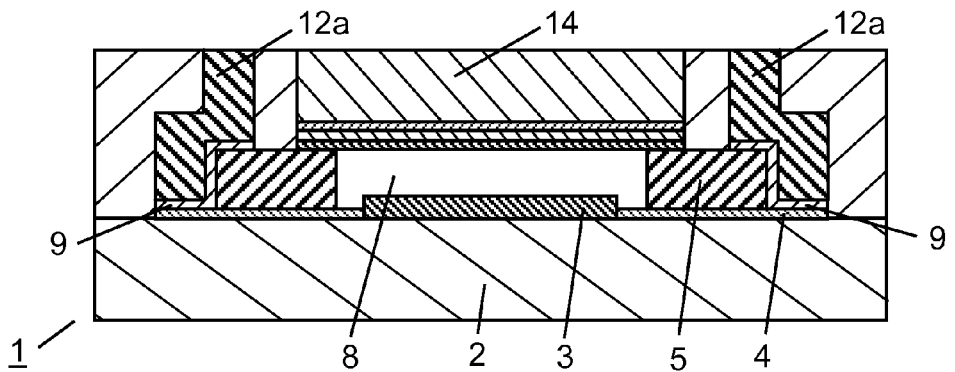

Next, as shown in FIG. 5A, a first electrolytic plating treatment is provided on electrode base layer 9 so as to form first connection electrodes 12a. At the same time, the electrolytic plating treatment is also provided on the top surface of cover base layer 13 so as to form cover reinforcing layer 14.

Figure 5B:
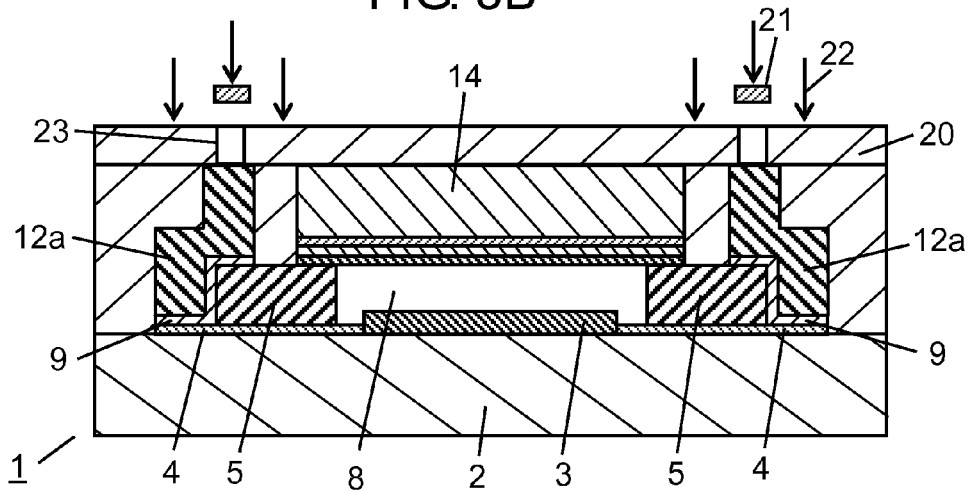

Next, as shown in FIG. 5B, photosensitive resist 20 is disposed on the top surfaces of first connection electrodes 12a and the top surface of cover reinforcing layer 14. On the top side of this resist 20 in the portions facing the top surfaces of first connection electrodes 12a, masks 21 each having a non-circular horizontal sectional shape are disposed. For example, the horizontal sectional shape of each mask 21 can be an elliptical shape such that the ratio of the long axis to the short axis is equal to or greater than 1.2, a polygonal shape such that the number of sides is equal to or smaller than 16, or a shape that includes a straight part having a length ranging from 35 μm to 80 μm inclusive, as shown in FIG. 2A through FIG. 2D. The preferable length of the straight part is not dependent on the thickness of the resist.

Next, resist 20 is irradiated with light 22 from the top surface of each mask 21, so that the portion of resist 20 other than the part under mask 21 is hardened. With reference to FIG. 5B, part of light 22 passes through photosensitive resist 20 and radiates to the top surface of first connection electrode 12a, and is reflected by the asperities on the top surface of first connection electrode 12a. Then, the reflected light radiates to the portion of the resist on the periphery of mask 21 (including the part right under the mask). Thus, resist wall surface 23 can serve as a light source that further reflects the light that has been reflected by the asperities on first connection electrode 12a.

When the horizontal section of mask 21 has an elliptical shape such that the ratio of the long axis to the short axis is equal to or greater than 1.2, the part of resist 20 right under mask 21 is a circular cylinder where the horizontal section has an elliptical shape. Therefore, the light reflected by resist wall surface 23 is concentrated on two separate focal points. The light energy in each focal point is weaker than the light energy concentrated on the center of a circle when the horizontal section is circular. That is, even the total light energy of the reflected light passing through the respective focal points of the ellipse does not reach the light energy capable of hardening photosensitive resist 20, and thus a resist block is not formed in the part right under mask 21.

When the horizontal sectional shape of mask 21 is a polygon such that the number of sides is equal to or smaller than 16, the part of resist 20 right under mask 21 is a polygonal cylinder where the horizontal sectional shape is a polygon such that the number of sides is equal to or smaller than 16. Thus, the light reflected by resist wall surface 23 forms conversing points everywhere in the horizontal section, and the light energy in each converging point is weaker than the light energy concentrated on the center of a circle when the horizontal section is circular. Therefore, even the total of the light that has been reflected by the asperities on the top surface of first connection electrode 12a and passes through the respective converging points does not produce light energy capable of hardening photosensitive resist 20, and thus a resist block is not formed in the part right under mask 21.

Further, the horizontal sectional shape of mask 21 may be a shape that includes a straight part having a length ranging from 35 μm to 80 μm inclusive, or a shape having different distances from the center of gravity to the periphery of the horizontal sectional shape. Also in these cases, the light reflected by resist wall 23 does not produce light energy capable of hardening photosensitive resist 20, and thus a resist block is not formed in the part right under mask 21.

Figure 5C:
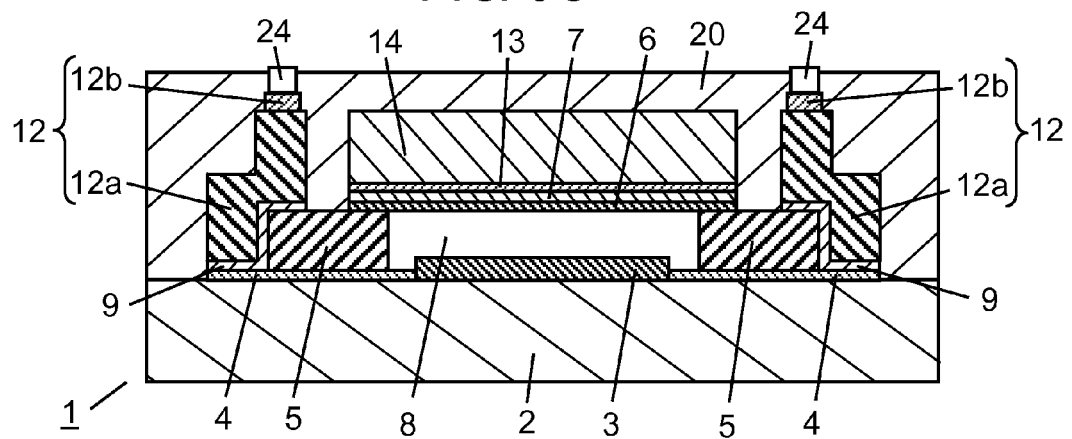

Next, the device having undergone the process up to FIG. 5B is immersed in a developing solution so that part of resist 20 having masks 21 on the top side is dissolved and removed. As a result, as shown in FIG. 5C, in the part under each mask 21, opening 24 having a horizontal sectional shape corresponding to the horizontal sectional shape of mask 21 is formed.

Next, by a second electrolytic plating treatment, second connection electrode 12b is formed in each opening 24. The horizontal sectional shape of the electrode is the same as the horizontal sectional shape of mask 21.

The horizontal sectional area of second connection electrode 12b is smaller than the horizontal sectional area of first connection electrode 12a. This structure allows second connection electrode 12b to be formed on the top surface of first connection electrode 12a with reliability, and improves the connection reliability of connection electrode 12, and thus the yield.

Next, the device is immersed and oscillated in a stripping solution, so that the resist pattern is removed. Thereafter, while the top surface of each connection electrode 12 is exposed, insulator 10 that covers the structure on the principal surface of piezoelectric substrate 2 is formed. Insulator 10 is formed by a printing method.

At last, external electrodes 11 to be electrically connected to connection electrodes 12 are formed on the top surfaces of connection electrodes 12. Then, piezoelectric substrate 2 and insulator 10 are simultaneously cut by dicing. Thereby, separate elastic wave device 1 as shown in FIG. 1 can be obtained from the collective substrate.

Elastic wave device 1 of this exemplary embodiment may be used in filters, such as a ladder type filter and a double mode SAW (DMS) filter. Further, using a filter that includes elastic wave devices 1, a semiconductor integrated circuit device connected to the filter, and a reproducer connected to the semiconductor integrated circuit device, an electronic device can be formed.

Second Exemplary Embodiment

Next, a description is provided for an elastic wave device in accordance with the second exemplary embodiment of the present invention, with reference to the accompanying drawings.

Figure 6:
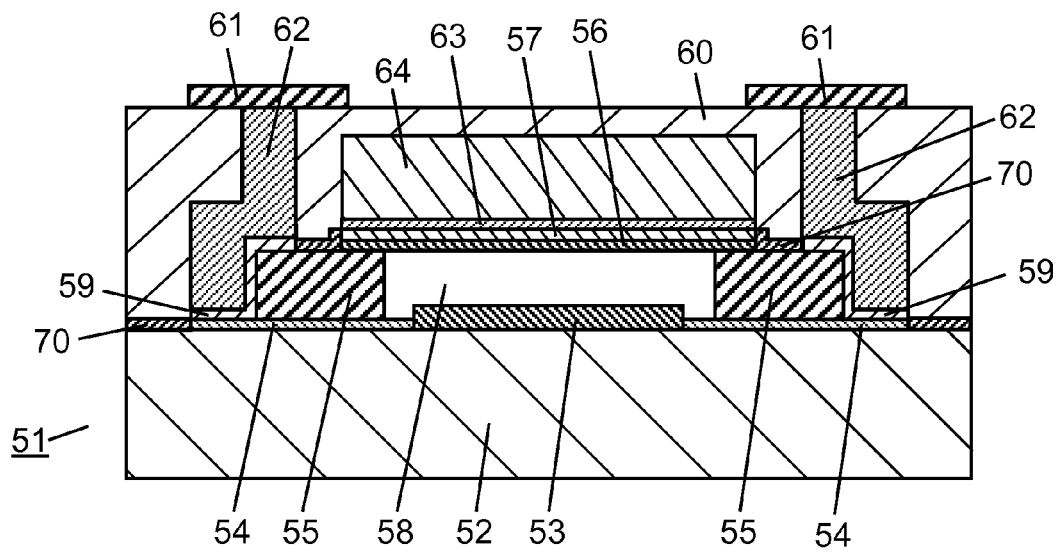
FIG. 6 is a sectional schematic view of an elastic wave device in accordance with a second exemplary embodiment of the present invention.

FIG. 6 is a sectional schematic view of an elastic wave device in accordance with the second exemplary embodiment of the present invention.

Elastic wave device 51 of FIG. 6 is a chip size package device. Elastic wave device 51 has piezoelectric substrate 52, inter-digital transducer (IDT) electrode 53, internal electrodes 54, side walls 55, cover 57, cover reinforcing layer 64, electrode base layer 59, external electrodes 61, connection electrodes 62, insulator 60, and inorganic insulating film 70.

Piezoelectric substrate 52 includes a single-crystal piezoelectric body approximately 100 to 350 μm in thickness. Examples of the material of piezoelectric substrate 52 include crystal, lithium tantalate, lithium niobate, and potassium niobate.

IDT electrode 53 is disposed on the top surface (principal surface) of piezoelectric substrate 52. IDT electrode 53 is a comb-shaped electrode approximately 0.1 to 0.5 μm in thickness. Examples of the material of IDT electrode 53 include a metal single substance of aluminum, copper, silver, gold, titanium, tungsten, platinum, chromium, or molybdenum, alloys predominantly composed of these substances, and a laminate of these metals.

Internal electrodes 54 are disposed on piezoelectric substrate 52 and electrically connected to IDT electrode 53. Internal electrodes 54 are conductors for electrically connecting IDT electrode 53 and external electrodes 61. Examples of the material of internal electrode 54 include a metal single substance of aluminum, copper, or silver, alloys predominantly composed of these substances, and a laminate of these metals.

Side walls 55 are disposed on the periphery of IDT electrode 53, on the top surface of piezoelectric substrate 52 or on the top surfaces of internal electrodes 54. Each of side walls 55 is a wall approximately 5 to 15 μm in height that surrounds at least part of the periphery of IDT electrode 53. As the material of side wall 55, resin is used because the resin can be formed into a predetermined shape easily. Especially when photosensitive resin is used as the material of side wall 55, side wall 55 that allow a plurality of elastic wave devices 51 to be disposed on piezoelectric substrate 52 can be formed into a desired shape at high precision. Examples of the photosensitive resin include various resin materials having photosensitivity, such as photosensitive polyimide resin, photosensitive epoxy resin, and photosensitive acrylate resin. The photosensitive polyimide resin has a high glass transition temperature, and thus use of the photosensitive polyimide resin can enhance the reliability in a high-temperature environment.

Cover 57 is disposed on the top side of side walls 55 so as to cover space 58 above IDT electrode 53. Cover 57 is a top plate held by adhesion to the top portions of side walls 55. The cover houses IDT electrode 53 in inside space 58, with piezoelectric substrate 52 and side walls 55. Cover 57 is approximately 1 to 10 μm in thickness.

Adhesive layer 56 contains a material, such as epoxy resin, which has an adhesion force to insulator 60 per unit area larger than that of side walls 55. Adhesive layer 56 bonds cover 57 and side walls 55.

When resin is used as cover 57, it is preferable to use of an adhesive sheet containing a photosensitive resin. Such an adhesive sheet has cover 57 and adhesive layer 56 combined together, and is easily worked into a predetermined shape. Examples of the photosensitive resin include various materials having photosensitivity, such as photosensitive polyimide resin, photosensitive epoxy resin, and photosensitive acrylate resin. Since the photosensitive polyimide resin has a high glass transition temperature, use of the photosensitive polyimide resin can enhance the reliability in a high-temperature environment.

When metal is used as cover 57, epoxy resin, polyphenylene resin, butadiene resin, or mixed resin of these resins can be used as adhesive layer 56.

Since metal has a high mechanical strength and electrical conductivity, use of metal as cover 57 allows the control of the electric potential of cover 57. Further, use of copper for cover 57 makes the coefficient of linear expansion of the cover substantially equal to that of single-crystal piezoelectric substrate 52.

Further, as cover 57, a foil type can be used. In this case, adhesive layer 56 is preformed on cover 57, and bonded to the top portions of side walls thereafter. This structure can provide higher handleability in manufacturing.

In this specification, space 58 refers to a region surrounded by piezoelectric substrate 52, side walls 55, and cover 57. Space 58 is hermetic and houses IDT electrode 53 inside thereof. Space 58 may be filled with normal-pressure air. However, sealing the inside of space 58 under a reduced pressure can prevent corrosion of IDT electrode 53.

Cover base layer 63 is a metal thin film formed on cover 57. Examples of the material of cover base layer 63 include a metal single substance of titanium, copper, nickel, chromium, or magnesium, and alloys predominantly composed of these substances. Use of titanium can enhance adhesion. When copper is disposed on titanium to form a two-layer structure of cover base layer 63, cover reinforcing layer 64 is easily formed. Cover base layer 63 serves as the base for electrolytic plating for forming cover reinforcing layer 64.

Cover reinforcing layer 64 contains a plating metal, and is disposed on cover 57 via cover base layer 63 so as to improve the mechanical strength of cover 57. Cover reinforcing layer 64 is a layer approximately 20 to 40 μm in thickness that is formed on the top surface of cover base layer 63 by electrolytic plating treatment. Examples of the material of cover reinforcing layer 64 include a metal single substance of copper, gold, silver, platinum, or nickel, and alloys predominantly composed of these substances. Use of copper as the material of cover reinforcing layer 64 provides a high mechanical strength and allows the coefficient of linear expansion of the layer to be matched to that of piezoelectric substrate 52.

Electrode base layer 59 is disposed on the top surfaces of internal electrodes 54, on the opposite sides of space 58 with respect to side walls 55, i.e. on the outer surfaces of side walls 55, and in part of the top surfaces of side walls 55. Electrode base layer 59 is a metal thin film, and is formed outside of side walls 55 on internal electrodes 54, i.e. on the outer side surfaces of side walls 55 on the opposite sides of space 58 with respect to side walls 55. Examples of the material of electrode base layer 59 include a metal single substance of titanium, copper, nickel, chromium, or magnesium, and alloys predominantly composed of these substances that have solubility in plating solution lower than that of internal electrode 54. Use of titanium can enhance adhesion. When copper is disposed on titanium to form a two-layer structure of electrode base layer 59, connection electrodes 62 to be described later are easily formed.

Insulator 60 contains organic resin, and is formed on piezoelectric substrate 52 so as to cover IDT electrode 53 so that IDT electrode 53 is protected from an external environment. Insulator 60 is formed so as to cover cover-reinforcing layer 64. Use of thermosetting resin as the material of insulator 60 can provide excellent handleability. Especially, epoxy resin is preferable in terms of heat resistance and hermeticity. Addition of inorganic filler to the epoxy resin can reduce the coefficient of linear expansion. Examples of the material of the inorganic filler include alumina powder, silicon dioxide powder, and magnesium oxide powder. The material of the inorganic filler is not limited to these powders, and various inorganic materials can be used.

External electrodes 61 are electrodes formed outside insulator 60 and electrically connected to connection electrodes 62. Since insulator 60 is formed between external electrodes 61 and side walls 55 in this exemplary embodiment, external electrodes 61 are not in direct contact with side walls 55.

Connection electrodes 62 contain a plating metal. Each of the connection electrodes is disposed on electrode base layer 59 so as to penetrate through insulator 60 and electrically connects external electrode 61 and IDT electrode 53. Connection electrode 62 is an electrode formed on internal electrode 54 via electrode base layer 59 by electrolytic plating treatment. Connection electrode 62 electrically connects to internal electrode 54. Examples of the material of connection electrode 62 include a metal single substance of copper, gold, silver, platinum, or nickel, and alloys predominantly composed of these substances. Use of copper as the material of connection electrode 62 provides a high mechanical strength and allows the coefficient of linear expansion of the electrode to be matched to that of piezoelectric substrate 52.

When connection electrode 62 is connected to an input/output terminal, connection electrode 62 is electrically insulated from cover 57, cover base layer 63, and cover reinforcing layer 64 by the function of inorganic insulating film 70 to be described later. On the other hand, when connection electrode 62 is connected to a ground terminal, the ground potential can be stabilized by connecting connection electrode 62 to cover 57, cover base layer 63, and cover reinforcing layer 64.

Elastic wave device 51 has inorganic insulating film 70 between insulator 60 and cover 57 and between insulator 60 and side walls 55. Inorganic insulating film 70 is disposed at least in the border portions between cover 57 and side walls 55, facing the side of insulator 60. Inorganic insulating film 70 is more difficult to permeate moisture than organic resin. Therefore, inorganic insulating film 70 is formed at least in the border portions between side walls 55 and cover 57, between insulator 60 and cover 57 and between insulator 60 and side walls 55. This structure prevents moisture from passing between cover 57 and side walls 55, and from entering into space 58 above IDT electrode 53. As a result, this structure can improve the moisture resistance of elastic wave device 51 and prevent the deterioration of characteristics over time caused by corrosion of IDT electrode 53.

As shown in FIG. 6, in elastic wave device 51, inorganic insulating film 70 is also formed outside connection electrodes 62 (i.e. on the opposite sides of side walls 55 with respect to connection electrodes 62) between insulator 60 and piezoelectric substrate 52. However, inorganic insulating film 70 is not necessarily formed in these portions. In elastic wave device 51, connection electrodes 62 and electrode base layer 59 that are made of metal more difficult to permeate moisture than organic resin are disposed outside of side walls 55. This structure can prevent the entry of moisture between insulator 60 and piezoelectric substrate 52.

Inorganic insulating film 70 is a protective film approximately 1 μm to 10 μm in thickness. For example, inorganic insulating film 70 is made of a material including at least one of silicon dioxide ($SiO_2$), silicon nitride (SiN), aluminum oxide ($Al_2O_3$), aluminum nitride (AlN), and magnesium oxide (MgO). For example, when insulator 60 contains inorganic filler made of silicon dioxide and inorganic insulating film 70 is made of silicon dioxide, the adhesion force between inorganic insulating film 70 and insulator 60 can be improved. In this manner, when inorganic insulating film 70 contains the same material as the inorganic filler contained in insulator 60, the adhesion properties between inorganic insulating film 70 and insulator 60 can be improved.

When cover 57 is made of metal, the moisture from the outside of the device is difficult to pass through cover 57, but passes through adhesive layer 56 relatively easily. In this case, inorganic insulating film 70 is not formed between cover 57 and insulator 60, and formed between adhesive layer 56 and insulator 60. This structure can inhibit the entry of moisture through adhesive layer 56 into space 58 above IDT electrode 53. When cover 57 is made of organic resin, inorganic insulating film 70 is formed entirely between cover 57 and insulator 60. This structure can inhibit the entry of moisture through cover 57 into space 58 above IDT electrode 53.

Inorganic insulating film 70 also serves to diffuse the heat generated from IDT electrode 53 to the outside of the device. For example, when side walls 55 are made of organic resin, inorganic insulating film 70 has higher heat conductivity than side walls 55. Thus, the heat generated from IDT electrode 53 is conducted by inorganic insulating film 70 and diffused to adjacent connection electrodes 62, for example. As a result, heat dissipation properties of elastic wave device 51 can be improved.

Figure 7:
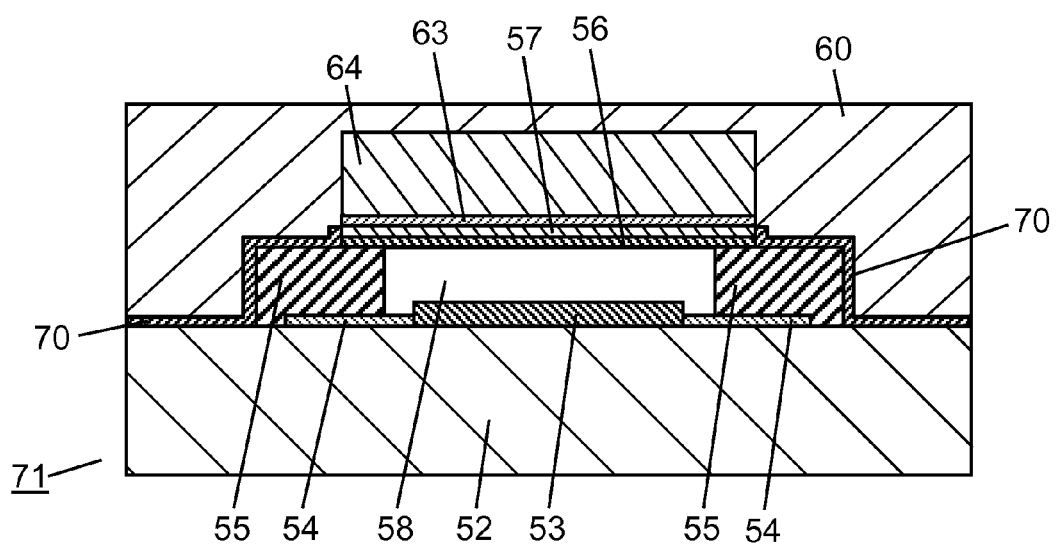
FIG. 7 is a sectional schematic view showing another example of the elastic wave device in accordance with the second exemplary embodiment.

Next, a description is provided for another structural example of the elastic wave device in accordance with the second exemplary embodiment of the present invention. FIG. 7 is a sectional schematic view showing another example of the elastic wave device in accordance with the second exemplary embodiment of the present invention.

Elastic wave device 71 of FIG. 7 is different from elastic wave device 51 of FIG. 6 in that elastic wave device 71 has no connection electrodes 62. Elastic wave device 71 has inorganic insulating film 70 between insulator 60 and cover 57 and between insulator 60 and side walls 55, and further has inorganic insulating film 70 between piezoelectric substrate 52 and insulator 60. Also the structure of elastic wave device 71 can prevent moisture from passing between cover 57 and side walls 55 and between piezoelectric substrate 52 and insulator 60, and from entering into space 58 above IDT electrode 53. Further, inorganic insulating film 70 can improve heat dissipation properties.

Next, a description is provided for a method for manufacturing elastic wave device 51 in accordance with the second exemplary embodiment, with reference to the accompanying drawings.

FIG. 8A through FIG. 8C, FIG. 9A through FIG. 9C, and FIG. 10A through FIG. 10C are diagrams each showing a manufacturing process of elastic wave device 51 in accordance with the second exemplary embodiment of the present invention.

Figure 8A:
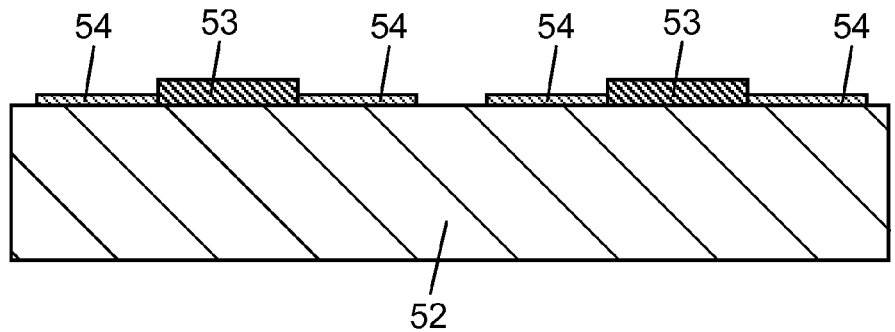
FIG. 8A through FIG. 8C, FIG. 9A through FIG. 9C, and FIG. 10A through FIG. 10C are diagrams each showing a manufacturing process of the elastic wave device in accordance with the second exemplary embodiment.

First, as shown in FIG. 8A, on the surface of piezoelectric substrate 52, a plurality of IDT electrodes 53 is sputtered and internal electrodes 54 are deposited by a photolithography technique using a resist.

Figure 8B:
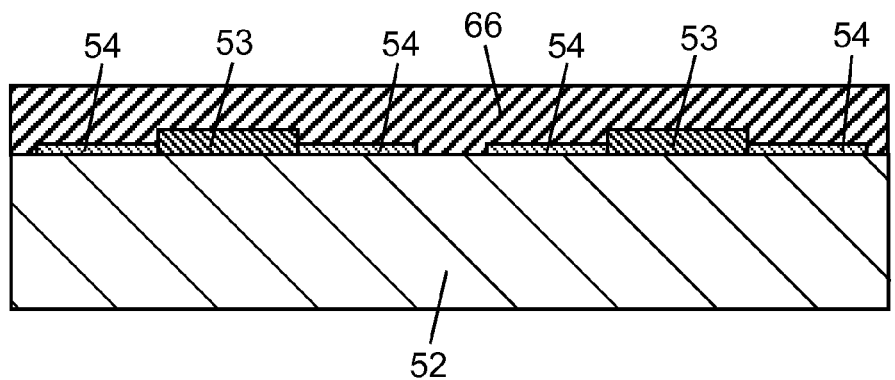

Next, as shown in FIG. 8B, photosensitive polyimide resin 66 is formed on piezoelectric substrate 52 by a film forming method, such as a spin-coating method, a dispensing method, and a screen-printing method. Polyimide resin 66 is formed on the entire principal surface of piezoelectric substrate 52 so as to cover IDT electrodes 53 and internal electrodes 54. Use of the spin-coating method to form polyimide resin 66 can provide a uniform film thickness.

Figure 8C:
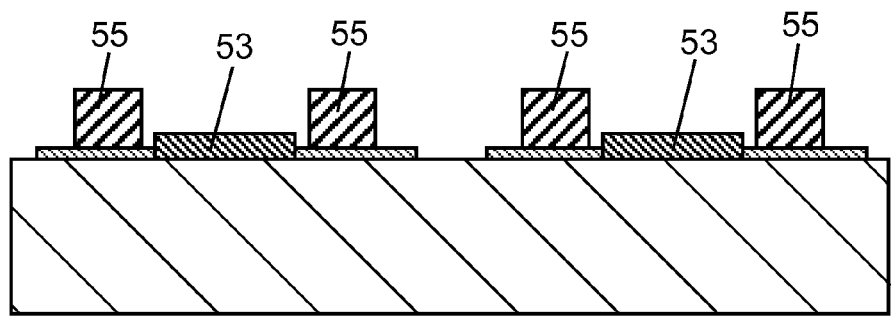

Next, polyimide resin 66 is exposed to light from the top surface, developed, and thermo-set. Thereby, as shown in FIG. 8C, side walls 55 surrounding IDT electrodes 53 can be formed. In this process, after side walls 55 are worked into a predetermined shape, the side walls are subjected to heat treatment as necessary so that the setting of the material is promoted.

Figure 9A:
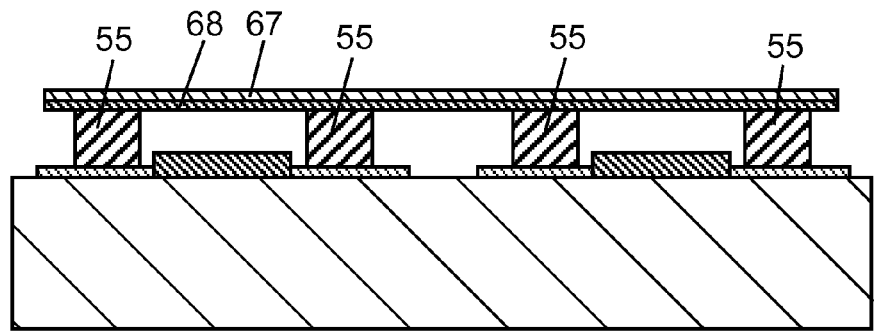
Figure 9B:
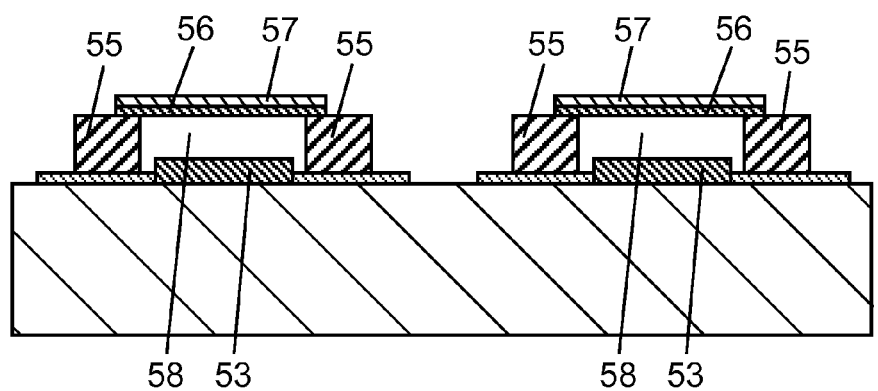

Next, as shown in FIG. 9A, metal foil 67 for forming cover 57 is bonded to the top surfaces of side walls 55 via adhesive agent 68. Then, by photolithography using a resist (not shown), metal foil 67 is etched into a predetermined pattern shape and the resist is removed. Thereafter, unnecessary portions of adhesive agent 68 are removed by dry etching. Thereby, as shown in FIG. 9B, a structure where cover 57 and adhesive layer 56 cover space 58 above IDT electrode 53 can be obtained.

Preferably, cover 57 and adhesive layer 56 do not remain on the entire top surface of each side wall 55. That is, preferably, cover 57 and adhesive layer 56 are formed inside the outer edge of the top surface of side wall 55 as viewed from the top. This is intended to avoid the following problem. If cover 57 and adhesive layer 56 protrude outwardly from the top surface of side wall 55 as viewed from the top, a base layer is difficult to adhere to the outer side surface of side wall 55 and the border portion between side wall 55 and piezoelectric substrate 52 when the base layer is sputtered thereafter.

Figure 9C:
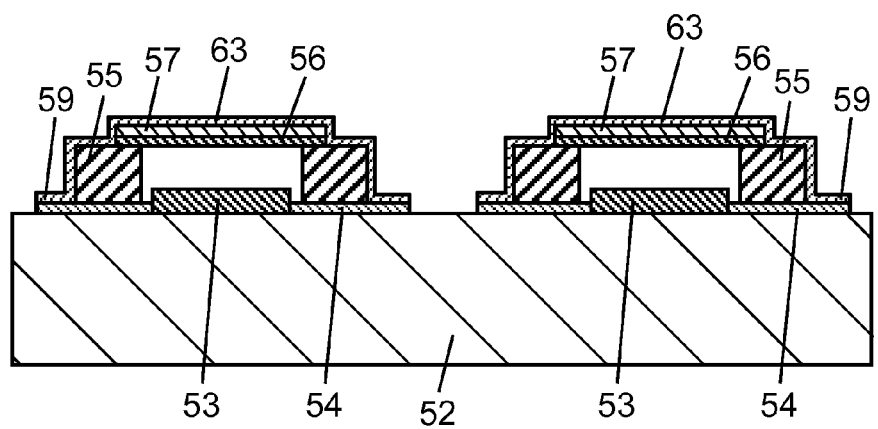

Next, as shown in FIG. 9C, the base layer that covers the top surface sides of internal electrodes 54, side walls 55, and cover 57 is formed by sputtering. Then, a resist (not shown) is formed by a photolithography technique in the portions other than connection electrodes 62 and cover reinforcing layer 64 to be formed next by the electrolytic plating growth on the top surface of the base layer formed. In this base layer, the part formed on the top surface of cover 57 is cover base layer 63, and the part formed on the top surface of internal electrode 54 is electrode base layer 59.

Figure 10A:
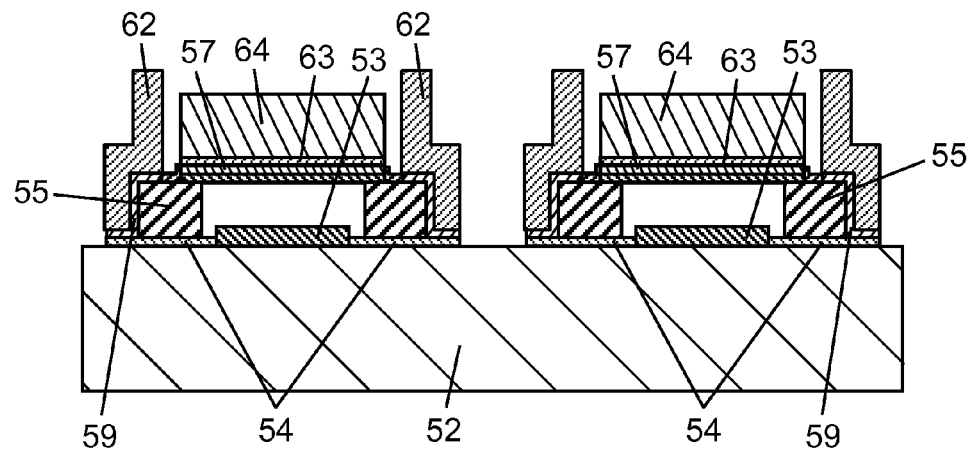

Next, as shown in FIG. 10A, connection electrodes 62 are formed. Specifically, while a resist is formed in the portions where connection electrodes 62 are not to be formed on electrode base layer 59 on the top surfaces of side walls 55, a first electrolytic plating treatment is provided on the portions where connection electrodes 62 are to be formed on the top surface of electrode base layer 59. Thereby, part of connection electrodes 62 is formed. At the same time, the electrolytic plating treatment is also provided on the top surface of cover base layer 63 so as to form cover reinforcing layer 64.

After the first electrolytic plating treatment, a resist is formed on the top surface of cover reinforcing layer 64, and in the portions where a second electrolytic plating treatment is not provided on the top surfaces of connection electrodes 62 formed by the first electrolytic plating treatment. Thereafter, the second electrolytic plating treatment is provided on part of connection electrodes 62. Thereby, the remaining portions of connection electrodes 62 are formed.

Next, the resist formed on the top surfaces of side walls 55 and the side surfaces of covers 57 is removed by a stripping solution and the base layer is removed by etching.

Figure 10B:
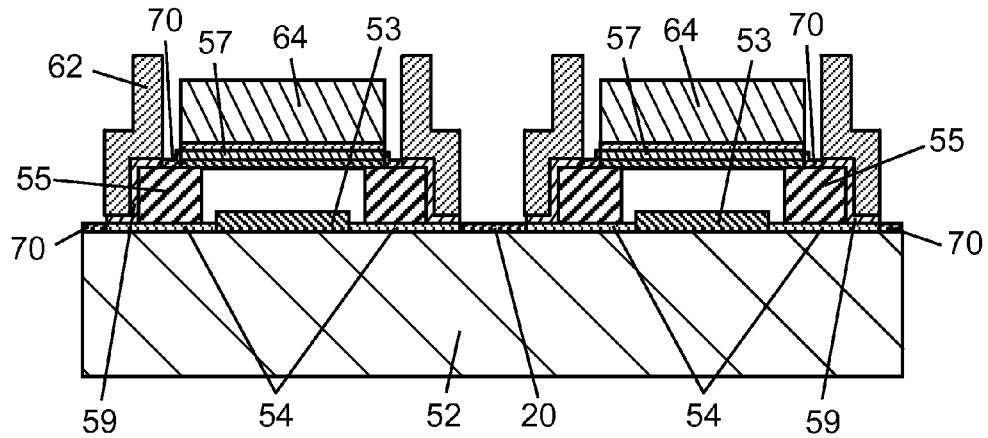

Thereafter, as shown in FIG. 10B, a resist (not shown) is formed on the top surfaces of connection electrodes 62 and cover reinforcing layer 64 by a photolithography technique, and inorganic insulating film 70 made of polysilazane is formed on the exposed top surfaces of side walls 55, side surfaces of cover 57, and top surface of piezoelectric substrate 52. This polysilazane contains inorganic polymers whose basic unit is (SiH$_2$NH)—. When polysilazane is fired and thereafter changed to room temperature, polysilazane converts to a compact silicon dioxide film.

Figure 11:
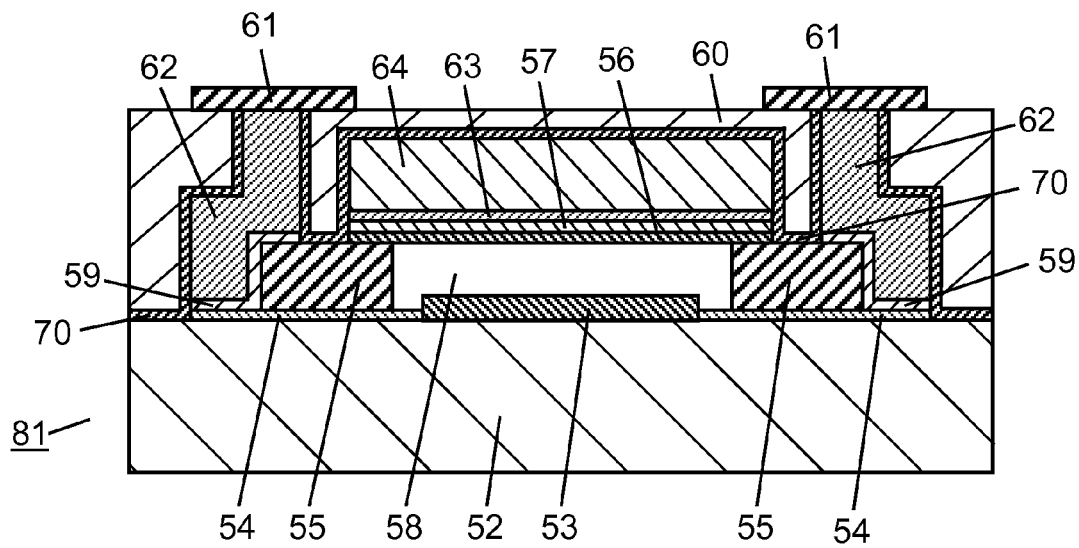
FIG. 11 is a sectional schematic view showing another example of the elastic wave device in accordance with the second exemplary embodiment.

Next, the device is immersed and oscillated in a stripping solution, so that the resist pattern is removed. At this time, polysilazane may be deposited on the entire top surface of the device without a resist formed. In this case, as shown by elastic wave device 81 of FIG. 11, inorganic insulating film 70 is formed on the top surface of cover reinforcing layer 64 and the side surfaces of connection electrodes 62 in the final form. FIG. 11 is a sectional schematic view showing another example of the elastic wave device in accordance with the second exemplary embodiment of the present invention. Also the structure of elastic wave device 81 can prevent moisture from passing between cover 57 and side walls 55 and between piezoelectric substrate 52 and insulator 60, and from entering into space 58 above IDT electrode 53. Inorganic insulating film 70 can also improve heat dissipation properties.

Figure 10C:
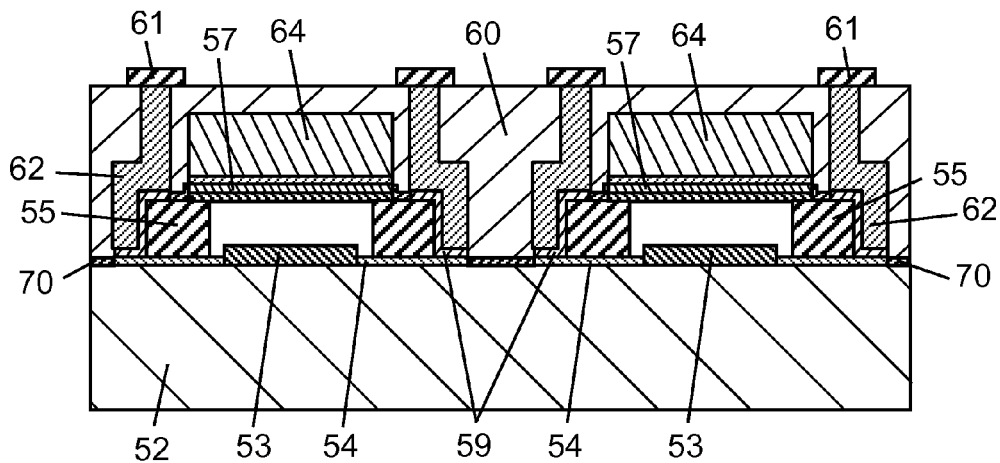

Next, as shown in FIG. 10C, while the top surface of each connection electrode 62 is exposed, insulator 60 that covers the top part of inorganic insulating film 70 on the top surface of piezoelectric substrate 52 and the structure on the principal surface of piezoelectric substrate 52 is formed. Insulator 60 is formed by a printing method.

At last, external electrodes 61 to be electrically connected to connection electrodes 62 are formed on the top surfaces of connection electrodes 62. Then, piezoelectric substrate 52 and insulator 60 are simultaneously cut by dicing. Thereby, separate elastic wave devices 51 are obtained from the collective substrate.

Next, a description is provided for a pattern arrangement of internal electrodes 54, side walls 55, cover 57, and inorganic insulating film 70 when elastic wave devices 51, 71, and 81 of the second exemplary embodiment are used in an elastic wave filter, with reference to the accompanying drawing.

Figure 12:
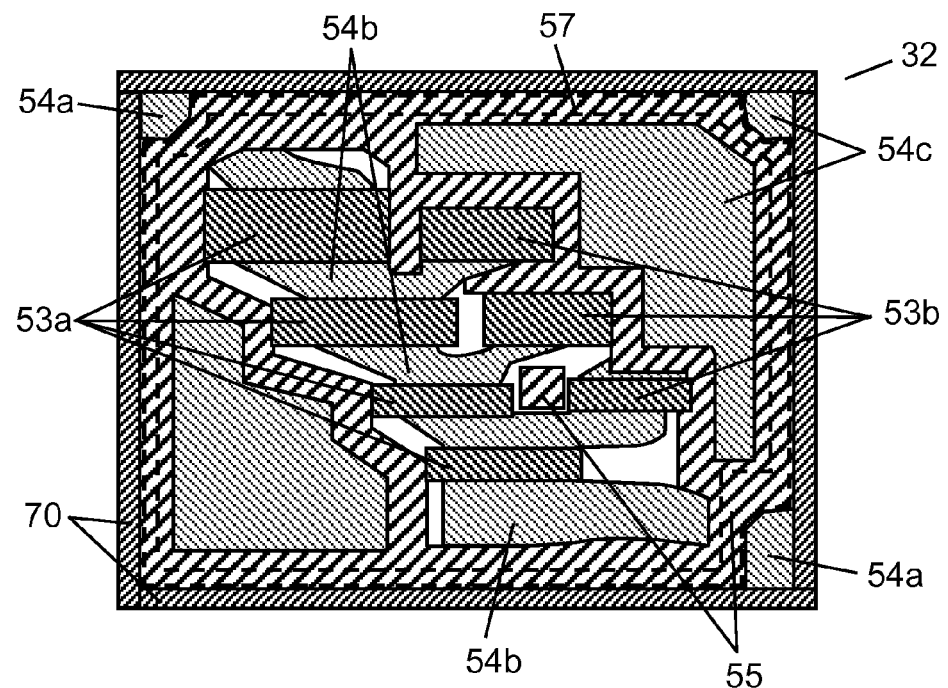
FIG. 12 is a top perspective view showing a pattern arrangement of internal electrodes, side walls, a cover, and an inorganic insulating film in an elastic wave filter in accordance with the second exemplary embodiment.

FIG. 12 is a top perspective view showing a pattern arrangement of internal electrodes 54a, 54b, and 54c, side walls 55, cover 57, and inorganic insulating film 70 in accordance with the second exemplary embodiment of the present invention. In FIG. 12, cover reinforcing layer 64, insulator 60, and connection electrodes 62 are omitted.

Elastic wave filter 32 using elastic wave devices 51, 71, and 81 is a ladder type filter. Elastic wave filter 32 has two pad internal electrodes 54a, wiring internal electrodes 54b, a plurality of series IDT electrodes 53a, ground internal electrodes 54c, and parallel IDT electrodes 53b on the surface of piezoelectric substrate 52.

Two pad internal electrodes 54a are connected to input/output terminals (not shown). The plurality of series IDT electrodes 53a is series-connected between two pad internal electrodes 54a via wiring internal electrodes 54b. Ground internal electrodes 54c are connected to ground terminals (not shown). Parallel IDT electrodes 53b are connected between ground internal electrodes 54c and wiring internal electrodes 54b.

In the broken lines of FIG. 12, the inner broken line shows the position of cover 57. Along this inner broken line, inorganic insulating film 70 disposed on the side surfaces of cover 57 is present. Further, also between the inner broken line and the outer broken line, inorganic insulating film 70 disposed on the top surfaces of side walls 55 is present. Further, in the diagonally shaded portions along the outer periphery of elastic wave filter 32, inorganic insulating film 70 disposed between piezoelectric substrate 52 and insulator 60 (not shown) is present.

Inorganic insulating film 70 disposed between piezoelectric substrate 52 and insulator 60 as shown in FIG. 12 prevents the entry of moisture from the outside of elastic wave devices 51, 71, and 81 into the inside of the devices. Inorganic insulating film 70 disposed in the border portions between side walls 55 and covers 57 inhibits the entry of moisture having entered inside the devices into spaces 58 above IDT electrodes 53. Thus, the moisture resistance of elastic wave devices 51, 71, and 81 can be improved.

Figure 13:
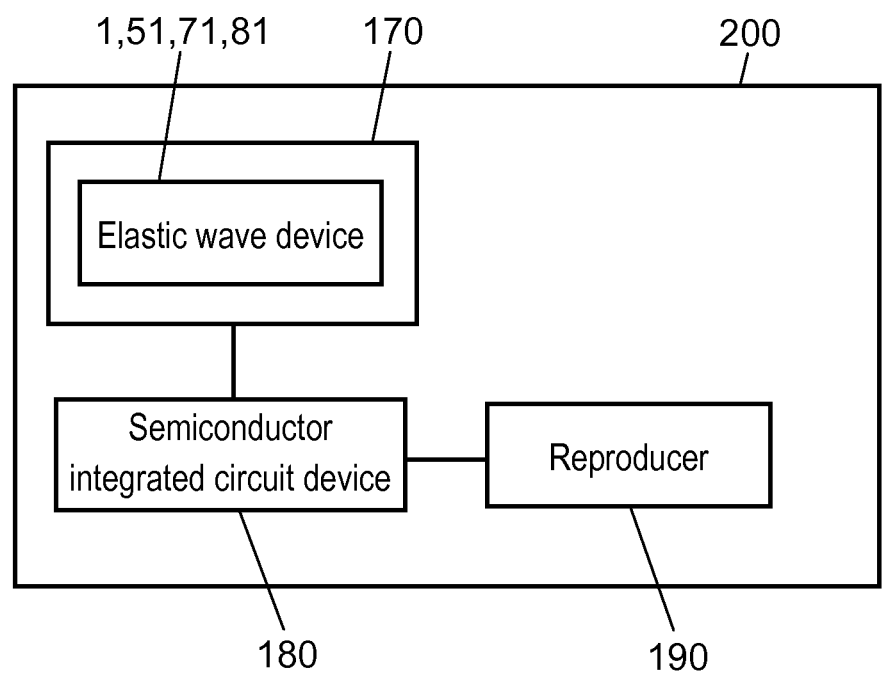
FIG. 13 is a block diagram showing a configuration of an electronic device in accordance with the exemplary embodiments of the present invention.
Figure 14:
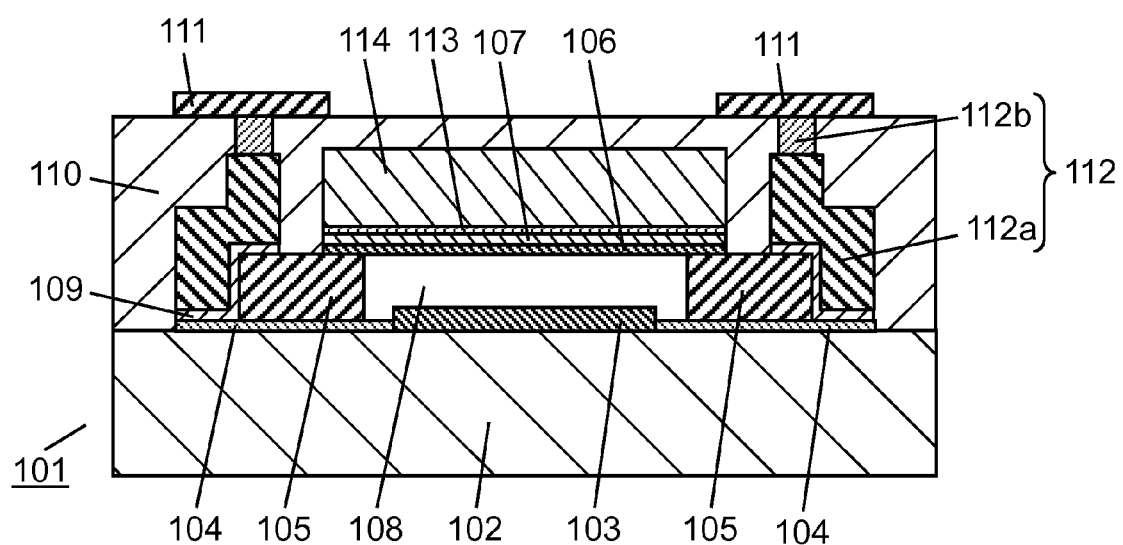
FIG. 14 is a sectional schematic view of a conventional elastic wave device.

Elastic wave devices 51, 71, and 81 of this exemplary embodiment can be used not only in a ladder type filter but also in other types of filters, such as a double mode SAW (DMS) filter. Further, as shown in FIG. 13, using filter 170 that includes elastic wave devices 1, 51, 71, and 81, semiconductor integrated circuit device 180 connected to filter 170, and reproducer 190 connected to semiconductor integrated circuit device 180, electronic device 200 can be formed. FIG. 13 is a block diagram showing a configuration of an electronic device in accordance with the exemplary embodiments of the present invention.

This configuration can prevent deterioration of communication quality in filter 170 and electronic device 200.

As described above, the elastic wave device of the present invention advantageously improves the yield of the elastic wave device, and can be used in an electronic device, such as a mobile communication device.

What is claimed is:

1. An elastic wave device comprising:
   a piezoelectric substrate;
   an inter-digital transducer (IDT) electrode disposed on the piezoelectric substrate;
   an internal electrode disposed above the piezoelectric substrate and electrically connected to the IDT electrode;
   a side wall disposed above the piezoelectric substrate surrounding the IDT electrode;
   a cover disposed above the side wall so as to cover a space above the IDT electrode; and
   a connection electrode disposed above the internal electrode,
   wherein the connection electrode has a first connection electrode disposed above the internal electrode, and a second connection electrode disposed on the first connection electrode, the second connection electrode has a horizontal sectional shape that is a non-circular shape, and the non-circular shape has a curved perimeter.

2. The elastic wave device of claim 1, wherein a horizontal sectional area of the second connection electrode is smaller than a horizontal sectional area of the first connection electrode.

3. The elastic wave device of claim 1, wherein the non-circular shape is an elliptical shape.

4. The elastic wave device of claim 3, wherein the non-circular shape is the elliptical shape such that a ratio of a long axis to a short axis is equal to or greater than 1.2.

5. An electronic device comprising:
   the elastic wave device of claim 1;
   a semiconductor integrated circuit device connected to the elastic wave device; and
   a reproducer connected to the semiconductor integrated circuit device.

6. An elastic wave device comprising:
   a piezoelectric substrate;
   an inter-digital transducer (IDT) electrode disposed on the piezoelectric substrate;
   an internal electrode disposed above the piezoelectric substrate and electrically connected to the IDT electrode;
   a side wall disposed above the piezoelectric substrate surrounding the IDT electrode;
   a cover disposed above the side wall so as to cover a space above the IDT electrode; and
   a connection electrode disposed above the internal electrode,
   wherein the connection electrode has a first connection electrode disposed above the internal electrode, and a second connection electrode disposed on the first connection electrode,
   wherein a horizontal sectional shape of the second connection electrode is a non-circular shape, and
   wherein the non-circular shape includes a straight part having a length ranging from 35 µm to 80 µm inclusive in a peripheral edge thereof.

7. The elastic wave device of claim 6, wherein a horizontal sectional area of the second connection electrode is smaller than a horizontal sectional area of the first connection electrode.

8. An electronic device comprising:
   the elastic wave device of claim 6;
   a semiconductor integrated circuit device connected to the elastic wave device; and
   a reproducer connected to the semiconductor integrated circuit device.

* * * * *